United States Patent [19]

Song et al.

[11] Patent Number: 5,366,909
[45] Date of Patent: Nov. 22, 1994

[54] METHOD FOR FABRICATING THIN FILM TRANSISTOR

[75] Inventors: Seung R. Song, Seoul; Hong S. Kim, Chungcheongbuk-do, both of Rep. of Korea

[73] Assignee: Goldstar Electron Co., Ltd., Rep. of Korea

[21] Appl. No.: 200,770

[22] Filed: Feb. 23, 1994

[30] Foreign Application Priority Data

Jan. 7, 1994 [KR] Rep. of Korea ............... 229/1994

[51] Int. Cl.$^5$ .......................................... H01L 21/265
[52] U.S. Cl. ........................................ 437/40; 437/21; 437/162; 437/913; 148/DIG. 150
[58] Field of Search ................. 437/40, 913, 21, 51, 437/911, 162, 101; 148/DIG. 150, DIG. 1

[56] References Cited

U.S. PATENT DOCUMENTS

| | | | |
|---|---|---|---|
| 4,294,555 | 3/1984 | Mano et al. | 437/21 |
| 4,943,837 | 7/1990 | Konishi et al. | 437/21 |
| 5,100,810 | 3/1992 | Yoshimi et al. | 148/DIG. 150 |

FOREIGN PATENT DOCUMENTS

| | | | |
|---|---|---|---|
| 6367782 | 3/1986 | Japan | 437/944 |
| 61-105869 | 5/1986 | Japan | 437/41 |
| 0202523 | 1/1990 | Japan | 437/51 |
| 2206132 | 8/1990 | Japan | 437/41 |
| 4120738 | 4/1992 | Japan | 437/40 |
| 4213430 | 8/1992 | Japan | 437/51 |

OTHER PUBLICATIONS

Paper Entitled "16Mbit SRAM Cell Technologies for 2.0V Operation" by H. Ohkubo, et al. Printed in the IEDM in 1991, pp. 481–484.

Paper Entitled "A Polysilicon Transistor Technology for Large Capacity SRAMs" by S. Ikeda, et al., Printed in the IEDM in 1990, pp. 469–472.

Primary Examiner—Brian Hearn
Assistant Examiner—Michael Trinh
Attorney, Agent, or Firm—Poms, Smith, Lande & Rose

[57] ABSTRACT

A method for fabricating a thin film transistor capable of increasing an ON/OFF current ratio and decreasing a consumption of electric power. The method includes the steps of sequentially depositing an insulating film and a first, high concentration p type semiconductor layer over a substrate, selectively removing a portion of the first semiconductor layer corresponding to a channel region, thereby forming a source region and a drain region, depositing a second, undoped semiconductor layer over the entire exposed surface of the resulting structure and implanting ions for controlling a threshold voltage in the second semiconductor layer, sequentially depositing a gate insulating film and a third semiconductor layer for a gate electrode over the entire exposed surface of the resulting structure and patterning the third semiconductor layer and the gate insulating film such that the third semiconductor layer and the gate insulating film are overlapped with the source region while being offset to the drain region, thereby forming the gate electrode, implanting p type impurity ions in a low concentration in an exposed portion of the second semiconductor layer using the gate electrode as a mask, and diffusing the p type impurity ions doped in both the source region and the drain region into the second semiconductor layer.

4 Claims, 8 Drawing Sheets

FIG. 4a
PRIOR ART
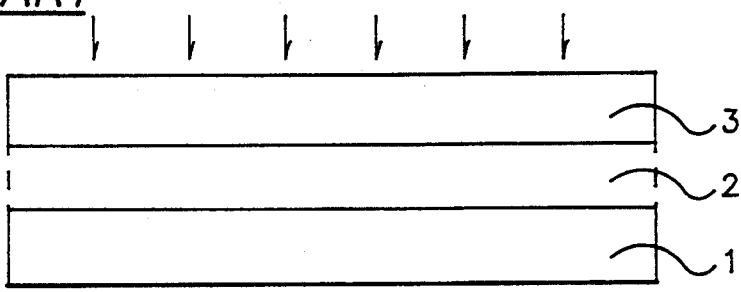
FIG. 4b
PRIOR ART
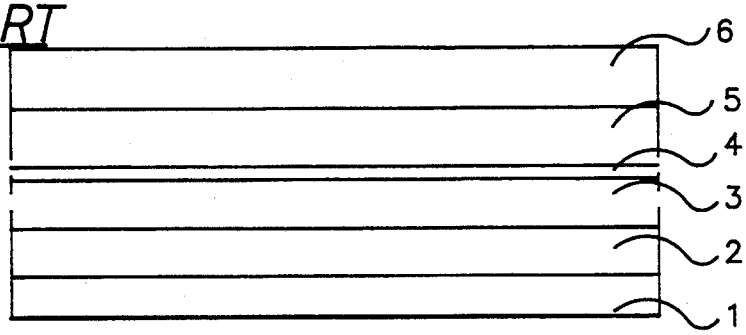
FIG. 4c
PRIOR ART
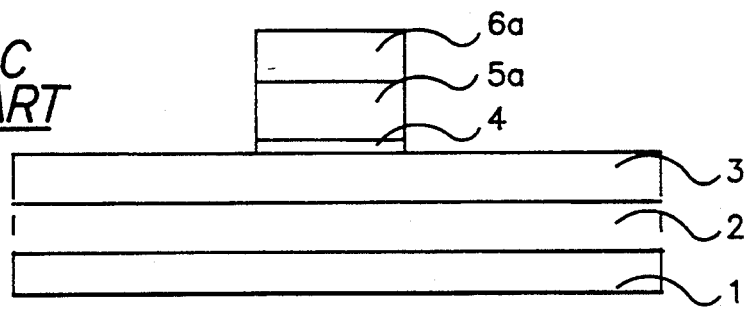
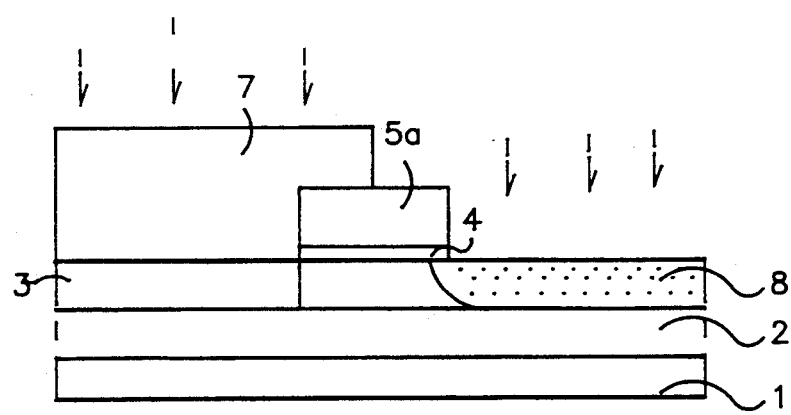
FIG. 4d
PRIOR ART

METHOD FOR FABRICATING THIN FILM TRANSISTOR

BACKGROUND OF THE INVENTION

The present invention relates to a method for fabricating a thin film transistor, and more particularly to a method for fabricating a thin film transistor capable of increasing an ON/OFF current ratio and decreasing a consumption of electric power.

Generally, thin film transistors are used in static random access memory (SRAM) devices of one mega-bit grade or greater, in place of load resistors. In liquid crystal displays (LCDs), such thin film transistors are widely used as switching devices for switching image data signals in pixel regions.

FIG. 1 is a circuit diagram of a high resistance-loaded SRAM. As shown in FIG. 1, the high resistance-loaded SRAM includes a pair of NMOS transistors $Q_1$ and $Q_2$ which are of flip-flops including crossing inverters having resistors $R_1$ and $R_2$ as their loads, respectively, to constitute a unit cell.

The unit cell is connected to data lines B/L and $\overline{B/L}$ by sources and drains of respective NMOS transistors $Q_3$ and $Q_4$. The gates of NMOS transistors $Q_3$ and $Q_4$ are connected to word lines W/L$_1$ and W/L$_2$, respectively.

When the word lines W/L$_1$ and W/L$_2$ are at a high level in the SRAM, the NMOS transistors $Q_3$ and $Q_4$ are turned on, so that the unit cell is electrically connected to both the data lines B/L and $\overline{B/L}$. For recording data of "1" under the above condition, a signal of 5 V corresponding to the data "1" is applied to the data line B/L. On the other hand, a signal of "0" (zero volt) is applied to the data line $\overline{B/L}$. As a result, the transistor $Q_1$ is turned off while the transistor $Q_2$ is turn on. Accordingly, the node $N_1$ charges up through the transistor $Q_3$ and keeps this state.

On the contrary, when data of "0" is to be recorded, a signal of "0" is applied to the data line B/L while a signal of "1" is applied to the data line $\overline{B/L}$. By these signals, the transistor $Q_1$ is turned on whereas the transistor $Q_2$ is turned off. As a result, the node $N_2$ charges up through the transistor $Q_4$ and keeps this state.

In the SRAM wherein data are stored by the above-mentioned operations, a standby current $I_{SB}$ generated when data of "1" is recorded can be expressed by the following equation (1) with respect to a current $I_R$ flowing the resistor $R_2$ and a leakage current $I_{leak}$ from the transistor $Q_1$.

$$I_{SB}=I_R+I_{leak} \tag{1}$$

In the equation (1), the leakage current $I_{leak}$ from the transistor $Q_1$ should not be more than 10 fA while the current $I_R$ should be more than 100 times the leakage current $I_{leak}$. Under this condition, the transistor $Q_1$ can be activated.

Assuming that the standby current $I_{SB}$ is less than 1 μA and the SRAM is of 4 mega-bit grade, a current of 250 fA per unit cell can be obtained.

Since the current $I_R$, should be more than 100 times the leakage current $I_{leak}$, the leakage current $I_{leak}$ can be ignored. Accordingly, the following equation (2) can be established.

$$I_{SB}=I_R=250 \text{fA/cell} \tag{2}$$

In the equation (2), the resistance of the resistor $R_1$ should be 20 TΩ, in order to obtain the current $I_R$ of 250 fA/cell. For obtaining the resistance of 20 TΩ, the resistor $R_1$ should have a thickness of 500 Å, a width of 0.6 μm, and a length of 60 μm. As a result, it is difficult to achieve a high integration.

For solving the problem that the high resistance-loaded SRAM is difficult to have an improved integration degree, CMOS type SRAMs have been developed. An example of such CMOS type SRAMs is illustrated in FIG. 2.

In the CMOS type SRAM, PMOS transistors $Q_5$ and $Q_6$ are used as load elements, in place of load resistors $R_1$ and $R_2$, as shown in FIG. 2. The CMOS type SRAM operates in the same manner as described in conjunction with FIG. 1.

Accordingly, the standby current $I_{SB}$ corresponds to the sum of the OFF current $I_{off}$ of the PMOS transistor $Q_6$ and the leakage current $I_{leak}$ of the NMOS transistor $Q_1$, as expressed by the following equation (3).

$$I_{SB}=I_{off}+I_{leak} \tag{3}$$

In this case, the leakage current $I_{leak}$ of the NMOS transistor $Q_1$ should be considerably less than the ON current $I_{on}$ of the PMOS transistor $Q_5$. For example, the ON current $I_{on}$ should be more than 100 times the leakage current $I_{leak}$ ($I_{on} > I_{leak} \times 100$). Generally, the leakage current $I_{leak}$ of the NMOS transistor $Q_1$ is about 10 fA.

Accordingly, assuming that the standby current $I_{SB}$ is less than 1 μA and the SRAM is of 4 mega-bit grade, a current of 250 fA per unit cell can be obtained.

Consequently, the leakage current $I_{leak}$ in the equation (3) corresponds to 10 fA/cell ($I_{leak}=10$ fA/cell) whereas the OFF current $I_{off}$ is not more than 250 fA/cell ($I_{off} \leq 250$ fA/cell).

Since the leakage current $I_{leak}$ is approximately equal to 10 fA/cell ($I_{leak} \approx 10$ fA/cell), the ON current $I_{on}$ of the PMOS transistor $Q_5$ should be more than 100 times the leakage current $I_{leak}$ ($I_{on} > I_{leak} \times 100 = 1$PA). Accordingly, a good current margin for retaining data is obtained. Assuming that a general data value is 10 nA, the current margin for retaining data corresponds to the ON/OFF current ratio of $10^3$ because the ON/OFF current ratio of the PMOS transistor is $10^5$ while the ON/OFF current ratio of the load resistor is $10^2$.

By virtue of such a characteristic, active researches for improving ON/OFF current ratios in PMOS thin film transistors used in CMOS type SRAMs have recently been made.

Now, a conventional PMOS thin film transister for improving the ON/OFF current ratio will be described in conjunction with the drawings.

FIGS. 3a to 3d are sectional views respectively illustrating a method for fabricating a conventional off-set type thin film transistor. In accordance with the method, an oxide film 2 and a body polysilicon layer 3 are sequentially deposited over a substrate 1, as shown in FIG. 3a. In the body polysilicon layer 3, ions for controlling a threshold voltage are implanted.

Over the entire exposed surface of the resulting structure, a gate oxide film 4, a polysilicon layer 5 for a gate and a first photoresist film 6 are deposited in this order, as shown in FIG. 3b.

Thereafter, a gate electrode region is defined by use of a light exposure process and a development process using a mask for a gate electrode pattern, as shown in FIG. 3c. The polysilicon layer 5 for the gate and the gate oxide film 4 are then selectively removed to form a gate electrode 5a. Subsequently, the first photoresist film 6 is removed.

As shown in FIG. 3d, a second photoresist film 9 is deposited to define a off-set region between the gate electrode 5a and a drain region. Using the gate electrode 5a and the second photoresist film 9 as a mask, p type impurity ions are implanted in a high concentration in the body polysilicon layer 3 to form a source region 10a and a drain region 10b.

FIGS. 4a to 4e are sectional views respectively illustrating a method for fabricating a conventional lightly doped off-set (LDO) type thin film transistor. In FIGS. 4a to 4e, elements corresponding to those in FIGS. 3a to 3d are denoted by the same reference numerals.

In accordance with this method, an oxide film 2 and a body polysilicon layer 3 are sequentially deposited over a substrate 1, as shown in FIG. 4a.

In place of the body polysilicon layer 3, an amorphous silicon layer may be formed. In this case, silicon ions are implanted in the amorphous silicon layer which is, in turn, subjected to an annealing at a temperature of 600°±50° C. for a long time. By these treatments, the amorphous silicon layer is formed into a polysilicon layer.

Thereafter, ions for controlling a threshold voltage are implanted in the body polysilicon layer 3.

Over the body polysilicon layer 3, a gate oxide film 4, a polysilicon layer 5 for a gate and a first photoresist film 6 are then deposited in this order, as shown in FIG. 4b.

Using a mask for a gate electrode pattern, the first photoresist film 6 is subjected to a light exposure process and a development process, thereby forming a first photoresist film mask 6a, as shown in FIG. 4c. Using the first photoresist film mask 6a as a mask, the polysilicon layer 5 for the gate and the gate oxide film 4 are then selectively removed to form a gate electrode 5a.

Subsequently, the first photoresist film mask 6a is removed. As shown in FIG. 4d, a second photoresist film 7 is deposited over the entire exposed surface of the resulting structure and then subjected to a light exposure process and a development process to expose a drain region disposed on one side of the gate electrode 5a. Using the second photoresist film 7 as a mask, p type impurity ions are implanted in a low concentration in the body polysilicon layer 3 to form a low concentration impurity region 8.

As shown in FIG. 4e, the second photoresist film 7 is then removed. Thereafter, a third photoresist film 9 is deposited over the entire exposed surface of the resulting structure. The third photoresist film 9 is then subjected to a light exposure process and a development process so that a source region disposed on the other side of the gate electrode 5a is exposed while the drain region disposed on one side of the gate electrode 5a is offset. Using the third photoresist film 9 as a mask, p type impurity ions are implanted in a high concentration in the exposed portion of the body polysilicon layer 3, thereby forming high concentration impurity regions 10a and 10b.

Operations of the conventional thin film transistors fabricated in the above-mentioned manners are the same as those of general PMOS transistors.

In other words, when a drive signal is applied to the gate electrode 5a, a channel is formed between the source region and the drain region. Accordingly, the source region and the drain region are communicated with each other.

However, the above-mentioned conventional thin film transistors have the following problems.

Although the off-set type thin film transistor fabricated in accordance with the method of FIGS. 3a to 3d can control the OFF current to be maintained at a lower level because the gate and the drain are offset, it can achieve an increased ON/OFF current ratio in that the ON current is also controlled to be at a lower level. On the other hand, the LDO type thin film transistor can control the ON current to be increased to a some high level because the low concentration impurity layer is formed in the off-set region. In this case, however, the OFF current is also controlled to be at a high level. As a result, the LDO type thin film transistor has a limitation on increasing the ON/OFF current ratio, even though its ON/OFF current ratio is higher than that of the off-set type thin film transistor.

A decrease in OFF current may be obtained by reducing the thickness of the body polysilicon layer in which the channel region is defined. However, such a reduced thickness of the body polysilicon layer results in an increase in surface resistance in the source and drain regions. As a result, a consumption of electric power is considerably increased. Consequently, there is a limitation on increasing the ON/OFF current ratio because the thickness of the body polysilicon layer can not be optionally reduced.

SUMMARY OF THE INVENTION

Therefore, an object of the invention is to solve the above-mentioned problems encountered in the prior arts and to provide a method for fabricating a thin film transistor capable of obtaining an increased ON/OFF current ratio and reducing a consumption of electric power.

In accordance with the present invention, this object can be accomplished by providing A method for fabricating a thin film transistor, comprising the steps of: sequentially depositing an insulating film and a first, high concentration semiconductor layer of a first conductivity type over a substrate; selectively removing a portion of said first semiconductor layer corresponding to a channel region, thereby forming a source region and a drain region; depositing a second, undoped semiconductor layer over the entire exposed surface of the resulting structure and implanting ions for controlling a threshold voltage in said second semiconductor layer; sequentially depositing a gate insulating film and a third semiconductor layer for a gate electrode over the entire exposed surface of the resulting structure and patterning said third semiconductor layer and said gate insulating film such that the third semiconductor layer and the gate insulating film are overlapped with said source region while being offset to said drain region, thereby forming said gate electrode; implanting impurity ions of the first conductivity type in a low concentration in an exposed portion of the second semiconductor layer using the gate electrode as a mask; and diffusing said first conductivity type impurity ions doped in both the source region and the drain region into the second semiconductor layer.

BRIEF DESCRIPTION OF THE DRAWINGS

Other objects and aspects of the invention will become apparent from the following description of embodiments with reference to the accompanying drawings in which:

FIGS. 4a to 4e are sectional views respectively illustrating a method for fabricating a conventional LDO type thin film transistor;

DETAILED DESCRIPTION OF THE PREFERRED EMBODIMENTS

FIGS. 5a to 5f are sectional views respectively illustrating a method for fabricating a thin film transistor in accordance with a first embodiment of the present invention.

Figure 1:
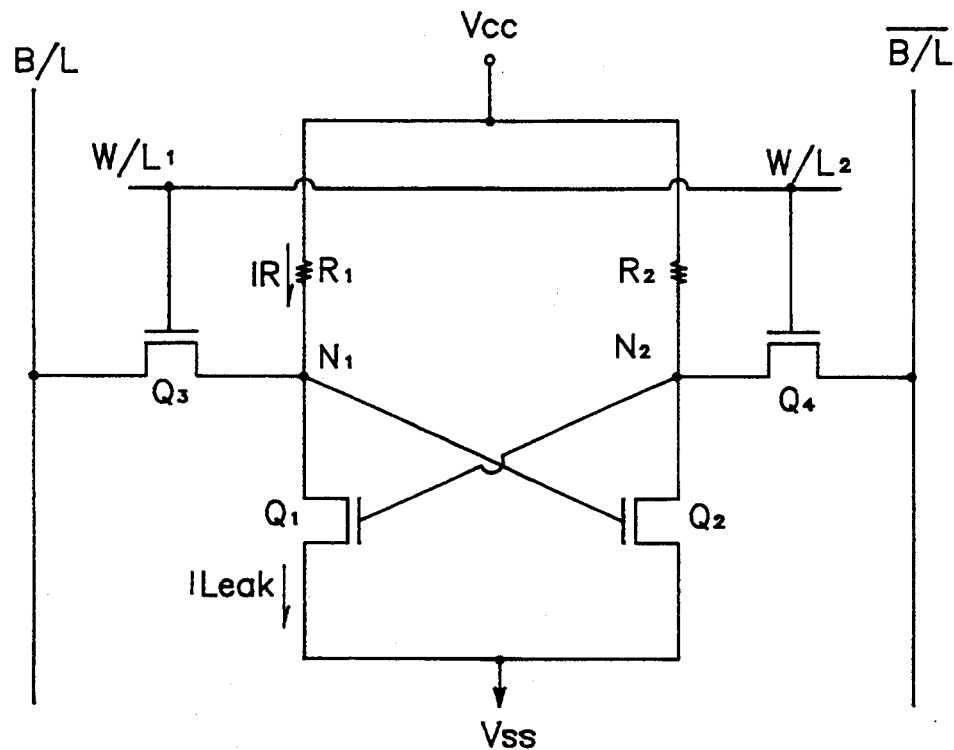
FIG. 1 is a circuit diagram of a high resistance-loaded SRAM.
Figure 2:
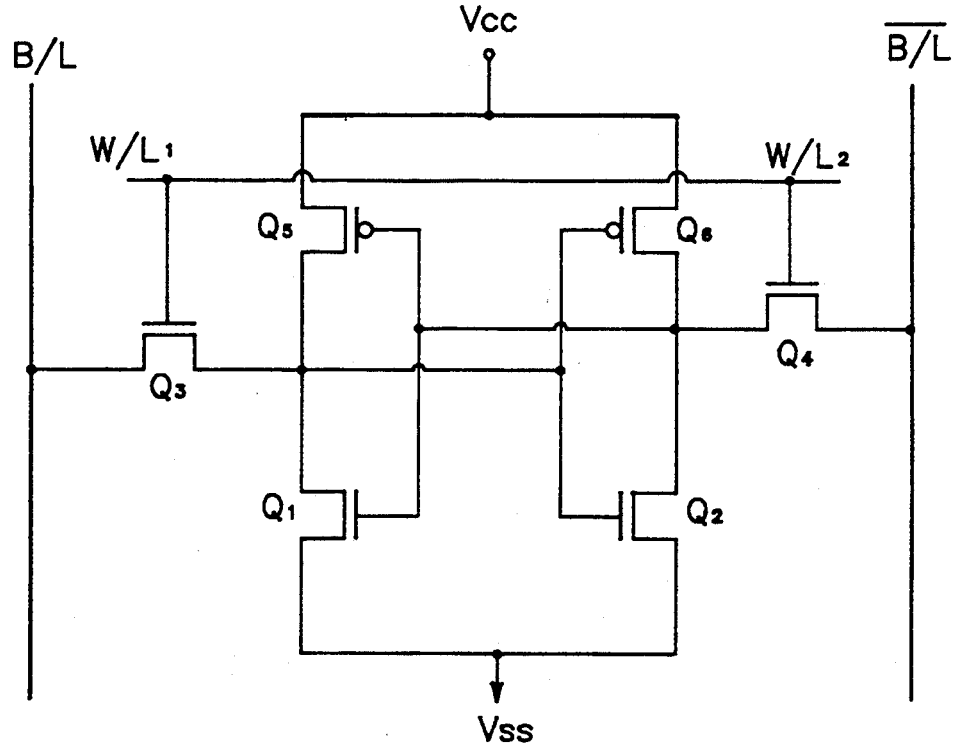
FIG. 2 is a circuit diagram of a general CMOS type SRAM.
Figure 3A:
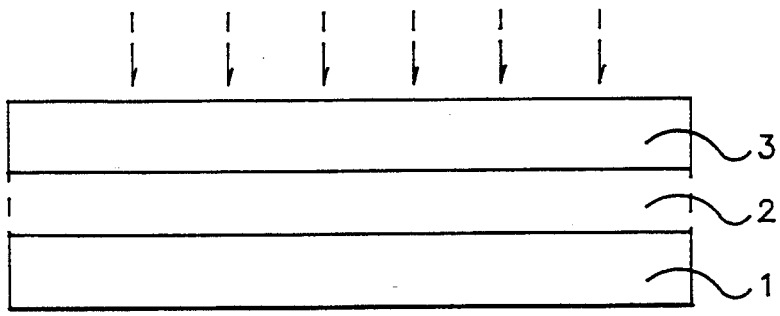
FIGS. 3a to 3d are sectional views respectively illustrating a method for fabricating a conventional off-set type thin film transistor.
Figure 3B:
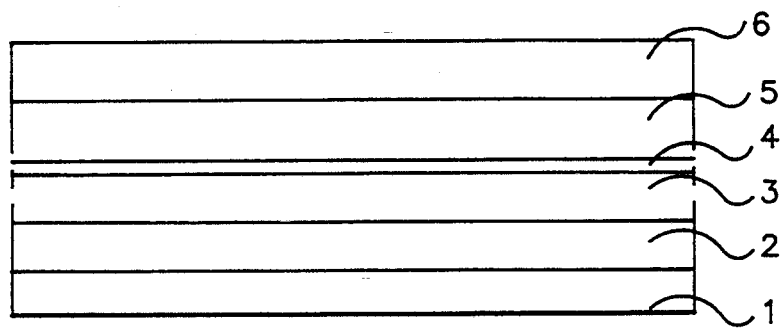
Figure 3C:
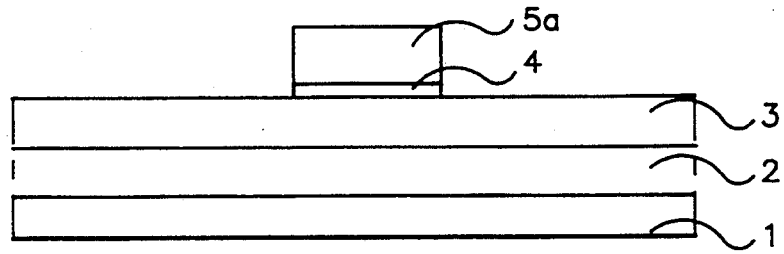
Figure 3D:
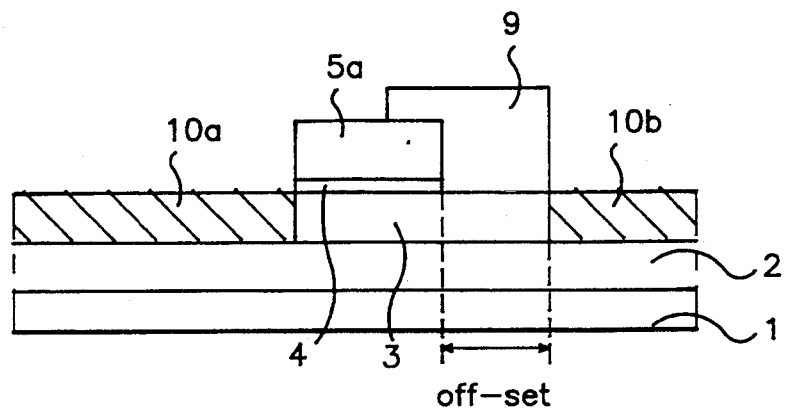
Figure 4E:
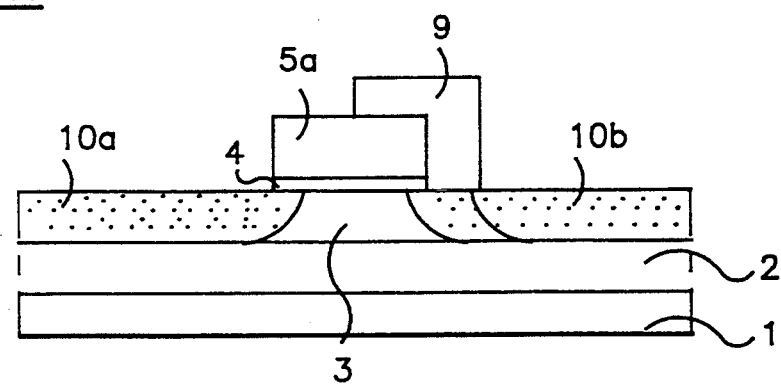
Figure 5A:
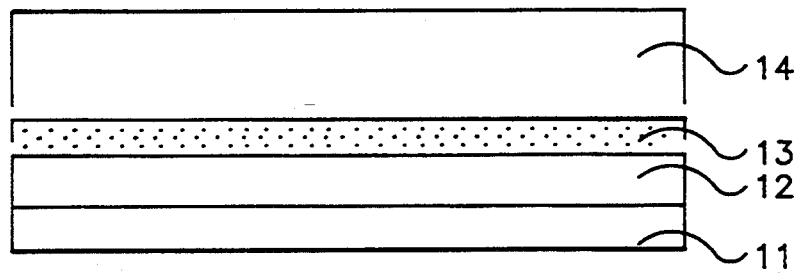
FIGS. 5a to 5f are sectional views respectively illustrating a method for fabricating a thin film transistor in accordance with a first embodiment of the present invention.

In accordance with the first embodiment, an insulating film 12 comprised of a silicon nitride ($Si_3N_4$) film is deposited over a substrate 11, as shown in FIG. 5a. Over the insulating film 12, a first semiconductor layer 13 doped with p type impurity ions in a high concentration is then deposited. Thereafter, a first photoresist film 14 is deposited over the first semiconductor layer 13.

The first semiconductor layer 13 is made of in-situ doped amorphous silicon or in-situ doped polysilicon.

Figure 5B:
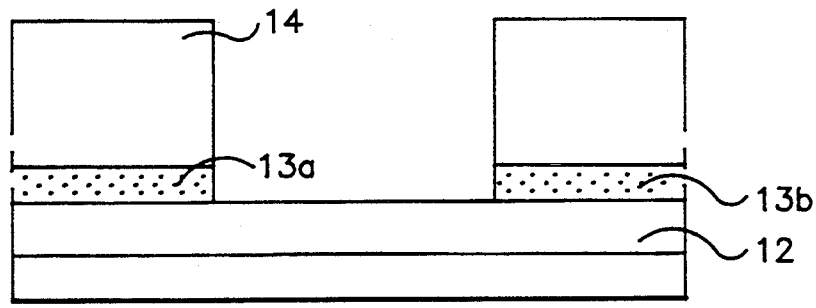

As shown in FIG. 5b, a channel region is defined by use of a light exposure process and a development process. Thereafter, a portion of the first semiconductor layer 13 corresponding to the channel region is selectively removed, thereby defining a source region 13a and a drain region 13b.

Figure 5C:
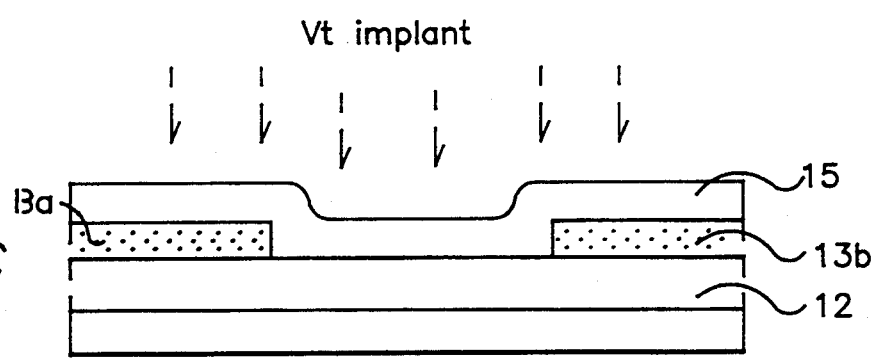

Subsequently, the first photoresist film 14 is removed, as shown in FIG. 5c. Over the entire surface of the resulting structure, a second semiconductor layer 15 doped with no impurity is deposited. The second semiconductor layer 15 is formed by depositing polysilicon or depositing amorphous silicon. In the latter case, the amorphous silicon layer is implanted with silicon ions and then annealed at a high temperature for a long time.

Then, ions for controlling threshold voltage is implanted in the second semiconductor layer 15.

Figure 5D:
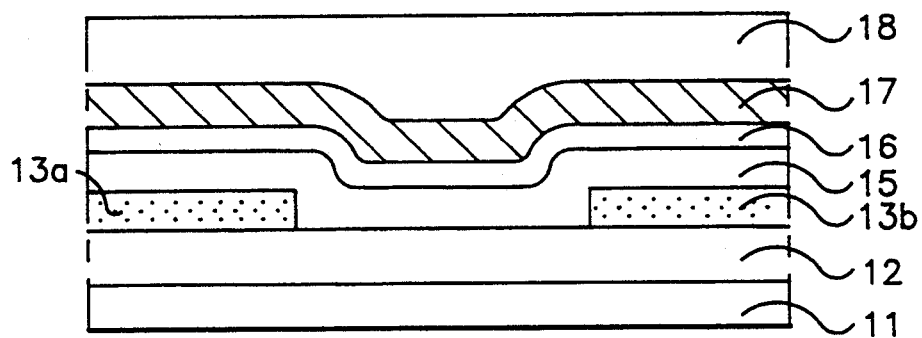

Over the second semiconductor layer 15, a gate insulating film 16, a third semiconductor layer 17 for a gate electrode and a second photoresist film 18 are then deposited in this order, as shown in FIG. 5d.

Figure 5E:
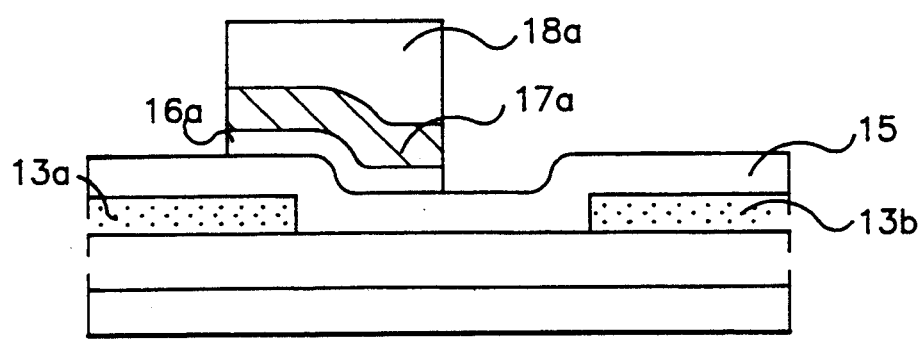

Thereafter, the second photoresist film 18 is patterned by use of a light exposure process and a development process under a condition that a mask for the gate electrode is used which is overlapped with the source region 13a while being offset to the drain region 13b, as shown in FIG. 5e. By this patterning, a second photoresist film pattern 18a is formed. Using the second photoresist film pattern 18a as a mask, the third semiconductor layer 17 and the gate insulating film 16 are then selectively removed to form a gate electrode 17a.

Figure 5F:
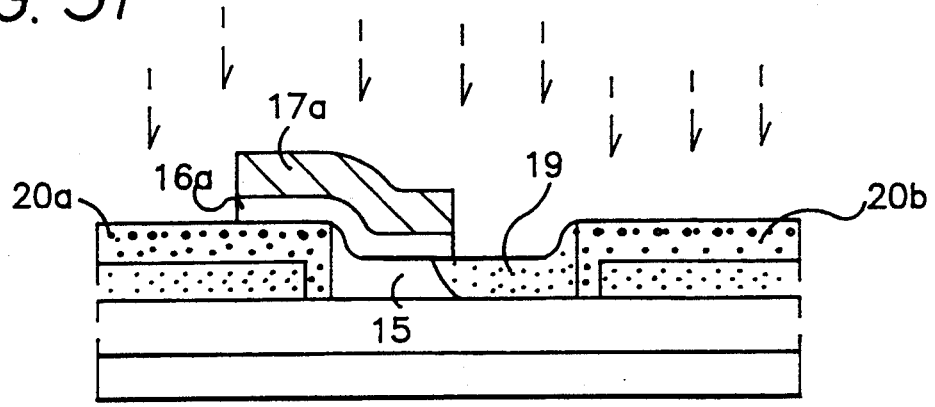

Subsequently, p type impurity ions are implanted in a low concentration in the exposed portion of the second semiconductor layer 15 under a condition that the gate electrode 17a is used as a mask, thereby forming a low concentration drain region 19, as shown in FIG. 5f.

The resulting structure is then subjected to an annealing so that the p type impurity ions doped in the source region 13a and the drain region 13b can be diffused in the second semiconductor layer 15 which is in contact with the source region 13a and the drain region 13b. By this annealing, a high concentration source region 20a and a high concentration drain region 20b are formed in the second semiconductor layer 15. Finally, the second photoresist film pattern 18a is removed. Thus, a thin film transistor in accordance with the first embodiment is obtained.

On the other hand, FIGS. 6a to 6g are sectional views respectively illustrating a method for fabricating a thin film transistor in accordance with a second embodiment of the present invention. In FIGS. 6a to 6g, elements corresponding to those in FIGS. 5a to 5f are denoted by the same reference numerals.

Figure 6A:
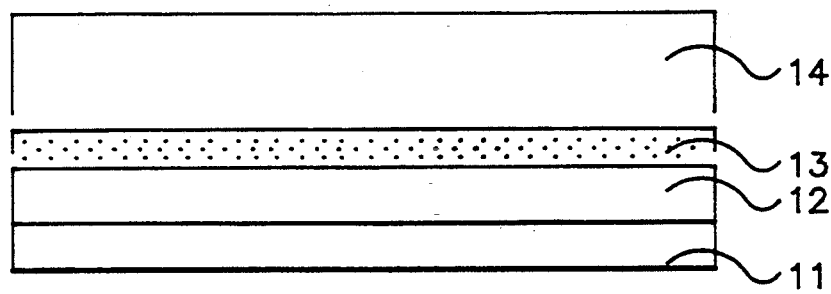
FIGS. 6a to 6g are sectional views respectively illustrating a method for fabricating a thin film transistor in accordance with a second embodiment of the present invention.

In accordance with the first embodiment, an insulating film 12 comprised of a silicon oxide ($SiO_2$) film is deposited over a substrate 11, as shown in FIG. 6a. Over the insulating film 12, a first semiconductor layer 13 doped with p type impurity ions in a high concentration is then deposited. Thereafter, a first photoresist film 14 is deposited over the first semiconductor layer 13.

In similar to the first embodiment, the first semiconductor layer 13 is made of in-situ doped amorphous silicon or in-situ doped polysilicon.

Figure 6B:
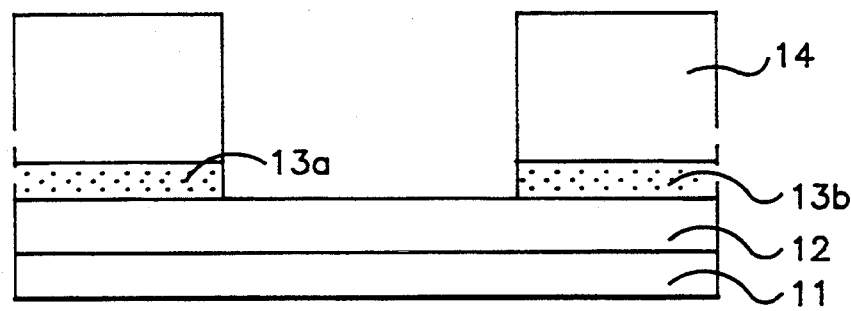

As shown in FIG. 6b, a channel region is defined by use of a light exposure process and a development process. Thereafter, a portion of the first semiconductor layer 13 corresponding to the channel region is selectively removed, thereby defining a source region 13a and a drain region 13b.

Figure 6C:
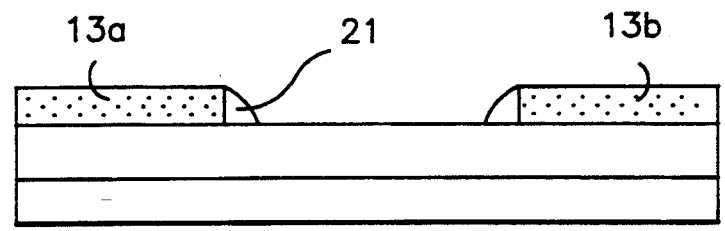

As shown in FIG. 6c, the first photoresist film 14 is then removed. Over the entire surface of the resulting structure, an insulating film such as an oxide film is then deposited. The insulating film is etched back by use of an anisotropic dry etch process, so that insulating film side walls 21 can be formed on facing side walls of the source and drain regions 13a and 13b, respectively.

Figure 6D:
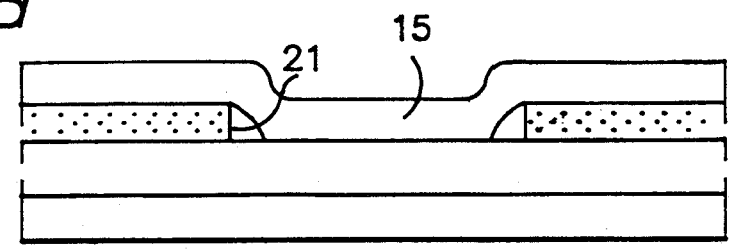

Thereafter, a second semiconductor layer 15 doped with no impurity is deposited over the entire exposed surface of the resulting structure, as shown in FIG. 6d. The second semiconductor layer 15 is formed by depositing polysilicon or depositing amorphous silicon. In the latter case, the amorphous silicon layer is implanted with silicon ions and then annealed at a high temperature for a long time.

Then, ions for controlling threshold voltage is implanted in the second semiconductor layer 15.

Figure 6E:
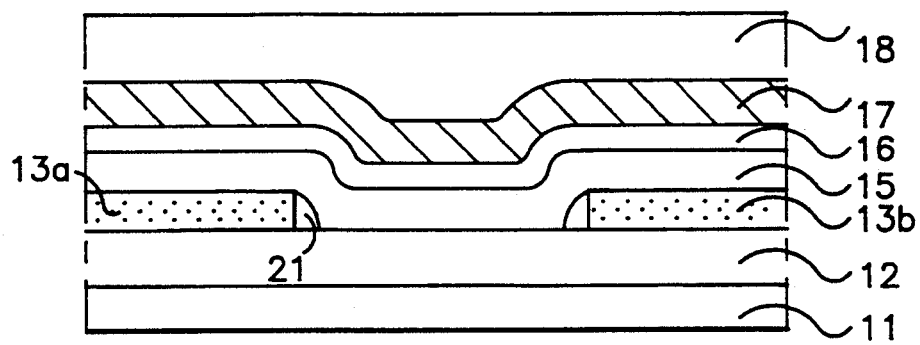

Over the second semiconductor layer 15, a gate insulating film 16, a third semiconductor layer 17 for a gate electrode and a second photoresist film 18 are then deposited in this order, as shown in FIG. 6e.

Figure 6F:
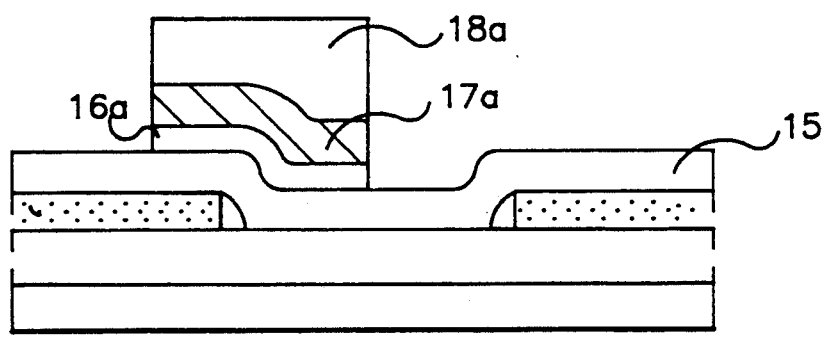

Thereafter, the second photoresist film 18 is patterned by use of a light exposure process and a development process under a condition that a mask for the gate electrode is used which is overlapped with the source region 13a while being offset to the drain region 13b, as shown in FIG. 6f. By this patterning, a second photoresist film pattern 18a is formed. Using the second photoresist film pattern 18a as a mask, the third semiconductor layer 17 and the gate insulating film 16 are then selectively removed to form a gate electrode 17a.

Figure 6G:
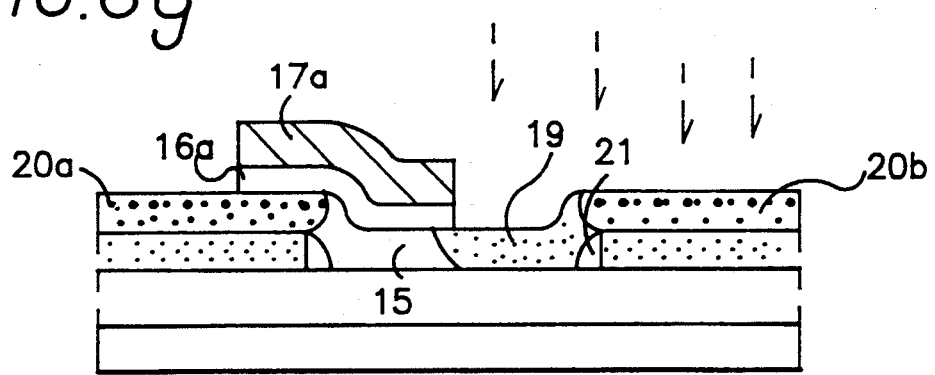

Subsequently, p type impurity ions are implanted in a low concentration in the exposed portion of the second semiconductor layer 15 under a condition that the gate electrode 17a is used as a mask, thereby forming a low concentration drain region 19, as shown in FIG. 6g.

The resulting structure is then subjected to an annealing so that the p type impurity ions doped in the source region 13a and the drain region 13b can be diffused in the second semiconductor layer 15 which is in contact with the p type impurity ions. By this annealing, a high concentration source region 20a and a high concentration drain region 20b are formed in the second semiconductor layer 15. Finally, the second photoresist film pattern 18a is removed. Thus, a thin film transistor in accordance with the second embodiment is obtained.

In accordance with the methods of the present invention, the following effects can be obtained.

Figure 7:
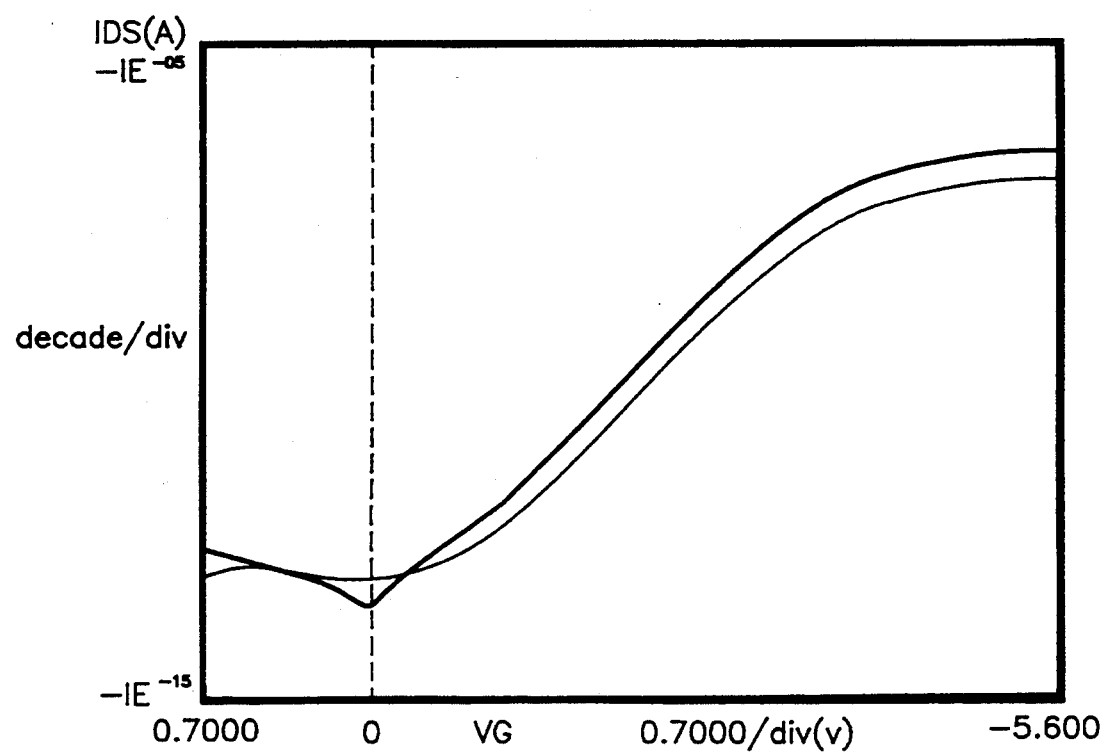
FIG. 7 illustrates characteristic curves of ON/OFF current ratios of the present invention and the prior art.

First, it is possible to maintain the OFF current at a low lever while maintaining the ON current at a high level. In accordance with the present invention, a LDO structure is provided because the gate electrode is self-aligned such that it is overlapped with the source region while being offset to the drain region. By virtue of the LDO structure, the ON current can be controlled to be at a higher level than that of the conventional structure by two or three times. As a result, it is possible to obtain an ON/OFF current ratio increased by 5 times or greater, over the conventional thin film transistors. This is apparent from FIG. 7 illustrating characteristic curves of ON/OFF current ratios of the present invention and the prior art.

Second, it is possible to fabricate a thin film transistor having an improvement in current driving capability because a polysilicon line is formed at source and drain regions except for their portions where a channel region is formed, thereby increasing the thickness of the same regions. As a result, the consumption of electric power in the overall structure can be reduced.

Third, where the thin film transistor of the present invention is applied to a SRAM device, it is possible to reduce a contact resistance generated when the thin film transistor comes into contact with other elements.

Although the preferred embodiments of the invention have been disclosed for illustrative purposes, those skilled in the art will appreciate that various modifications and additions are possible, without departing from the scope and spirit of the invention as disclosed in the accompanying claims.

What is claimed is:

1. A method for fabricating a thin film transistor, comprising the steps of:
   sequentially depositing an insulating film and a first, high concentration semiconductor layer of a first conductivity type over a substrate;
   selectively removing a portion of said first semiconductor layer corresponding to a channel region, thereby forming a source region and a drain region;
   depositing a second, undoped semiconductor layer over the entire exposed surface of the resulting structure and implanting ions for controlling a threshold voltage in said second semiconductor layer;
   sequentially depositing a gate insulating film and a third semiconductor layer for a gate electrode over the entire exposed surface of the resulting structure and patterning said third semiconductor layer and said gate insulating film such that the third semiconductor layer and the gate insulating film are overlapped with said source region while being offset to said drain region, thereby forming said gate electrode;
   implanting impurity ions of the first conductivity type in a low concentration in an exposed portion of the second semiconductor layer using the gate electrode as a mask; and
   diffusing said first conductivity type impurity ions doped in both the source region and the drain region into the second semiconductor layer.

2. A method for fabricating a thin film transistor in accordance with claim 1, wherein said first semiconductor layer is comprised of an in-situ doped polysilicon layer or an in-situ doped amorphous silicon layer.

3. A method for fabricating a thin film transistor in accordance with claim 1, wherein said step of depositing said second semiconductor layer comprises the steps of depositing an amorphous silicon layer over the entire exposed surface of the resulting structure after the formation of said source region and said drain region, implanting silicon ions in said amorphous silicon layer, and annealing the resulting structure at a high temperature.

4. A method for fabricating a thin film transistor, comprising the steps of:
   sequentially depositing a first insulating film and a first, high concentration semiconductor layer of a first conductivity type over a substrate;
   selectively removing a portion of said first semiconductor layer corresponding to a channel region, thereby forming a source region and a drain region;
   forming side walls comprised of a second insulating film on facing side surfaces of said source region and said drain region defining a channel region;
   depositing a second, undoped semiconductor layer over the entire exposed surface of the resulting structure and implanting ions for controlling a threshold voltage in said second semiconductor layer;
   sequentially depositing a gate insulating film and a third semiconductor layer for a gate electrode over the entire exposed surface of the resulting structure and patterning said third semiconductor layer and said gate insulating film such that the third semiconductor layer and the gate insulating film are overlapped with said source region while being offset to said drain region, thereby forming said gate electrode;
   implanting impurity ions of the first conductivity type in a low concentration in an exposed portion of the second semiconductor layer using the gate electrode as a mask; and
   diffusing said first conductivity type impurity ions doped in both the source region and the drain region into the second semiconductor layer.

* * * * *